United States Patent [19]

Louzon

[11] 3,772,079

[45] Nov. 13, 1973

[54] METHOD OF ENCAPSULATING AN ELECTRICAL DEVICE IN INSULATING AND METAL MATERIALS

[75] Inventor: Theodore John Louzon, Bolingbrook, Ill.

[73] Assignee: Western Electric Company, Incorporated, New York, N.Y.

[22] Filed: Sept. 18, 1972

[21] Appl. No.: 289,810

[52] U.S. Cl. ................ 117/217, 29/25.42, 117/218, 174/52 PE

[51] Int. Cl. ............................................ C23b 5/50

[58] Field of Search .................... 317/242, 258, 260; 174/52 PE; 338/257; 117/217, 218; 29/25.42

[56] References Cited

UNITED STATES PATENTS

| | | | |
|---|---|---|---|
| 1,811,067 | 6/1931 | Valle | 317/260 |
| 1,817,174 | 8/1931 | Brock | 174/126 CP |
| 2,549,770 | 4/1951 | Bornham | 317/260 |
| 2,903,629 | 9/1959 | Walker | 174/52 PE |
| 3,109,969 | 11/1963 | Siedel | 317/258 |
| 3,348,568 | 10/1967 | Stark | 317/258 |

*Primary Examiner*—E. A. Goldberg
*Attorney*—W. M. Kain et al.

[57] ABSTRACT

An electrical device having a pair of projecting leads, such as a capacitor or a capacitor assembly, is encapsulated by forming an inner insulating layer about a body of the device and sections of the leads adjacent the body. A moisture-proof and/or other type protective metal layer then is formed about the inner insulating layer so that it terminates at points short of the ends of the inner insulating layer on the leads, whereby insulated portions of the leads are exposed and the metal layer is electrically insulated from the body of the device and the leads. An outer protective layer, which also may be of insulating material, then is formed about the metal layer and the exposed insulated portions of the leads to entrap the metal layer within the inner and outer layers. The forming of each layer preferably is accomplished by dipping, with the metal layer being formed by dipping in a semi-molten solder composition having a relatively low melting point. Any voids in the solder composition layer then may be sealed by subsequently dipping in a molten metal solution having a melting point on the order of or less than that of the solder composition.

4 Claims, 7 Drawing Figures

PATENTED NOV 13 1973

3,772,079

METHOD OF ENCAPSULATING AN ELECTRICAL DEVICE IN INSULATING AND METAL MATERIALS

BACKGROUND OF THE INVENTION

1. Field of the Invention

This invention relates to an encapsulated electrical device and a method of fabrication, and more particularly to an encapsulated electrical capacitor or capacitor assembly having relatively high moisture resistance and capacitance stability, and to a method of fabricating the encapsulated capacitor or capacitor assembly.

2. Description of the Prior Art

In the manufacture of polystyrene capacitors made of alternately wound layers of electrode material and dielectric material, it is standard practice to package each capacitor by wrapping it in plastic tape and then impregnating it's ends with a suitable epoxy resin. Capacitors manufactured in this manner, however, tend to display an excessive permanent capacitance shift upon being subjected to high moisture conditions and therefore, are not suitable in certain applications. Further, while the moisture-proof capability of capacitors packaged in this way can be improved significantly by hermetically sealing them in a suitable manner, this is undesirable because of the expense involved.

One solution to the problem of producing capacitors having high moisture resistance involves potting a capacitor (or a capacitor assembly) in an aluminum can lined with an insulating layer of cured epoxy resin, which also provides an adherent surface for the potting material. In this arrangement, after the capacitor has been placed in the lined aluminum can, the can is filled with epoxy resin and the resin is cured to form a relatively hard layer of substantial thickness over the capacitor body. During the curing of the epoxy resin, it fuses with the epoxy resin liner and bonds to the projecting leads of the capacitor, whereby the aluminum can and the epoxy resin material (as a result of its substantial thickness) produce a protective moisture-proof enclosure for the capacitors. However, while a capacitor encapsulated in this manner has good moisture resistance and capacitance stability under high moisture conditions, the process still is relatively expensive because of the steps of forming the can, lining the can with cured epoxy resin, assembling the capacitor in the can and finally potting the capacitor in the can.

SUMMARY OF THE INVENTION

In accordance with this invention, an electrical device which has a body with a pair of projecting leads is encapsulated by forming an inner insulating layer about the body of the device and sections of the leads adjacent thereto. A metal protective layer then is formed about the inner insulating layer and along portions of the leads such that the metal layer terminates at points short of the ends of the insulating layer on the leads and is electrically insulated from the body of the electrical device and the leads. An outer protective layer then is formed about the metal layer.

In a specific embodiment of the invention, an inner insulating layer is formed by dipping the body of the electrical device and the adjacent sections of the leads in a resin solution which may contain an insulating filler material to reduce the consistency of the solution and to increase the thickness of the solution which will coat onto the body of the electrical device and the leads. A metal moisture-proof layer then is formed by dipping the electrical device in a solder solution having a relatively low melting point, with the solder solution being in only a semi-molten state so that solder will quickly solidify about the electrical device to form the metal moisture-proof layer when the electrical device is withdrawn from the semi-molten solder solution. Any voids in the metal moisture-proof layer then may be sealed by subsequently dipping the electrical device in a molten metal solution having a melting point not substantially greater than that of the solder solution used to form the metal moisture-proof layer. Finally, an outer protective layer is formed about the metal moisture-proof layer and exposed portions of the inner insulating layer on the leads to entrap the metal layer within the inner insulating layer and the outer protective layer, by dipping the electrical device in a solution of insulating material, such as the resin solution used to form the inner insulating layer.

DETAILED DESCRIPTION

Figure 1A:
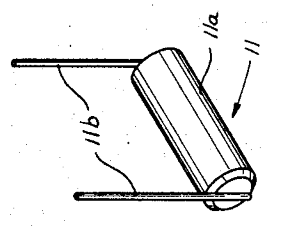
FIGS. 1A, B and C show several electrical devices which may be encapsulated in accordance with the invention.

FIGS. 1A, B and C illustrate, by way of example, several electrical devices to which the disclosed embodiment of the invention may be applied. Thus, FIG. 1A discloses a device 11 in the form of a single capacitor body **11*a* having a pair of radially projecting leads 11*b*, FIG. 2A discloses an assembly 12 of two capacitor bodies 12*a* having a pair of radially projecting leads 12*b*, and FIG. 1C discloses an assembly 13 of capacitor bodies 13*a* interconnected by leads 13*b* to form a body which also has a pair of projecting terminal leads 13*c*. Each of the capacitor bodies 11*a*, 12*a* or 13*a* is of the type which is wound from alternate layers of an electrode material, such as a tin-lead alloy foil, and a dielectric material, such as a biaxially oriented polystyrene film, and which then is subjected to a suitable heat treatment to stabilize its capacitance value. The ends of each capacitor body 11*a*, 12*a* or 13*a* then are crimped and spin-swaged to compact the foil extending therefrom and the leads 11*b*, 12*b* or 13*b*** are attached to the ends of the capacitor bodies by welding in a suitable manner. Other electrical devices, such as other types of capacitors, resistors, inductors, semiconductors, etc., also are adapted to be encapsulated by the method of this invention.

Figure 1B:
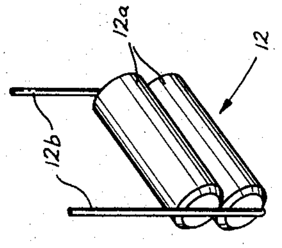
Figure 1C:
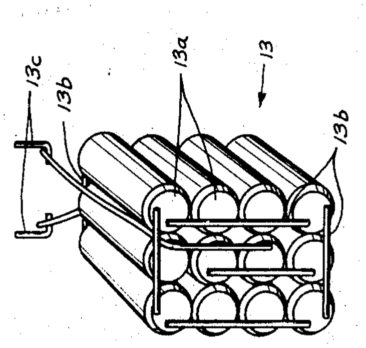

FIGS. 2, 3, 4 and 5 illustrate the invention as applied to the encapsulating of the single capacitor device 11 shown in FIG. 1A, with it being understood that the encapsulation of the dual capacitor assembly 12 of FIG. 1B or the multiple capacitor assembly 13 of FIG. 1C would be accomplished in the same manner. Further, while in the disclosed embodiment of the invention encapsulation of the device 11 is shown as being accomplished by a series of dipping operations, it is contemplated that encapsulation could be accomplished by spraying, casting, plating, vapor deposition or other known coating techniques. Similarly, while the encapsulating materials are disclosed as being epoxy resins and solder compositions, the insulating materials could be of any other suitable type, such as other plastics, lacquers, paints, waxes, rubber, etc., and the metal utilized could be of any other suitable type, such as nickel, cobalt, tantalum, etc.

Figure 2:
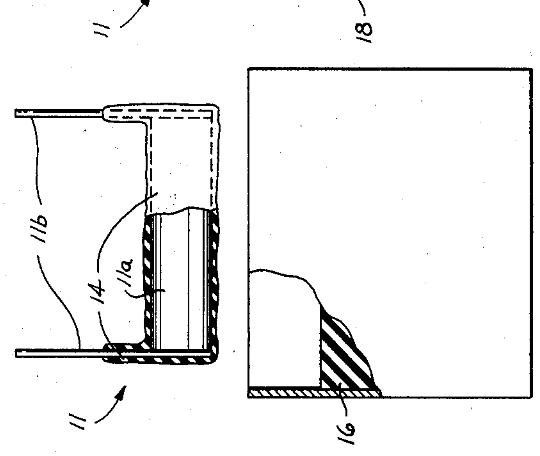
FIG. 2 illustrates a first encapsulating step in accordance with the invention.

Referring to FIG. 2, in the disclosed embodiment of the invention the capacitor 11 initially is coated with an inner form-fitting layer 14 of electrical insulating material by dipping the capacitor body **11*a* and sections of the leads 11*b* adjacent the ends of the body in a solution or bath 16 of the insulating material. Preferably, the dipping material is an epoxy resin which may contain an insulating filler, such as silica flakes, to increase its consistency and to increase the thickness of the layer 14 which is formed in the dipping operation. The epoxy resin layer 14 then is cured in a conventional manner at a temperature which will not have a detrimental effect on the capacitor 11, in this instance not in excess of 180°F, so that it hardens and bonds to the capacitor body 11*a* and the leads 11*b***. For example, the epoxy resin may be a bisphenol A-type compound available under the trade name "Epi-Rez" (Number 5071) from the Celanese Resins Division, Celanese Corporation, Louisville, Kentucky, which will cure at room temperature when mixed with a suitable hardener.

Figure 3:
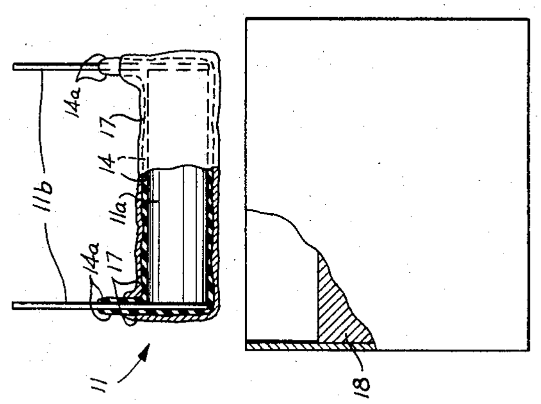
FIG. 3 illustrates a second encapsulating step in accordance with the invention.

Referring to FIG. 3, an intermediate form-fitting layer or shield 17 of metal then is formed on the inner layer 14 of insulating material to form a moisture-proof barrier for the capacitor body **11*a*. The metal layer 17 also is formed along the leads 11*b* of the capacitor 11 such that outer end portions 14*a* of the inner insulating layer 14 on the leads remain exposed and such that the metal layer will be electrically insulated from the capacitor body 11a and the leads. Preferably, the metal layer 17 is formed as a solder encasement by dipping the capacitor 11 in a solder bath 18 which has a melting point below the melting point of the inner insulating layer 14**, and below 180°F so as not to cause heat damage to the capacitor. For example, the solder bath may be a composition of 50% bismuth (Bi), 26% lead (Pb), 13.3% tin (Sn) and 10% cadium (Cd), with up to 1% being impurities, this composition having a melting point on the order of 158°F.

Since molten solder normally will not wet and bond to epoxy resin, in forming the metal encasement 17 by dipping as above described, the solder bath 18 preferably is maintained at a temperature whereby it is in only a semi-molten (or semi-solid) "mushy" state, so that solder will cool and solidify rapidly about the capacitor body **11*a* and the leads 11*b* to produce the encasement when the capacitor 11 is withdrawn from the bath. In this regard, the condition of the solder bath 18 should be such that while the solder may not become physically bonded to the inner insulating layer 14, the solder will solidify rapidly enough about the capacitor body 11*a* and the leads 11*b* to form a one-piece "shell" which then will be mechanically retained on the capacitor body and the leads as a result of being of integral rigid construction and in surrounding relationship with respect thereto. On the other hand, if the solder bath 18 is maintained in a molten state at a relatively high temperature, it may tend to drain off of the inner insulating layer 14 before it can solidify to form a covering about the capacitor body 11a and the leads 11b** of sufficient uniformity and thickness.

Figure 4:
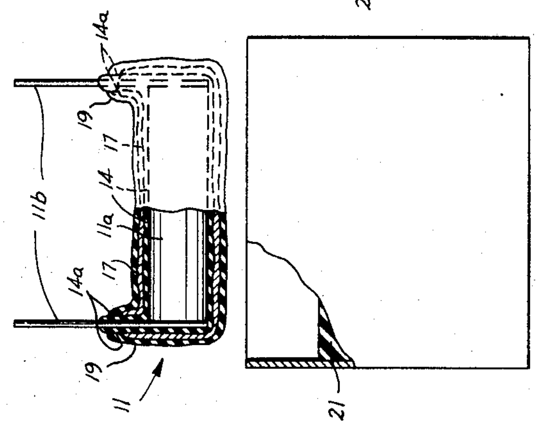
FIG. 4 illustrates a final encapsulating step in accordance with the invention, and a finished encapsulated electrical capacitor.

Referring to FIG. 4, the final step of the disclosed embodiment of the invention involves forming an outer form-fitting protective layer 19 over the metal encasement 17 and the exposed portions **14*a* of the inner insulating layer 14 on the leads 11*b*, such as by dipping the capacitor 11 in a solution or bath 21 of a material which will produce a hard tough coating when solidified and which will bond to the metal encasement 17 and fuse to the exposed portions of the inner insulating layer to enclose the encasement within the inner insulating layer and the outer protective layer. While the outer protective layer 19** need not necessarily be of insulating material, it can have this characteristic, and can be formed of the same type epoxy resin as used to form the inner insulating layer, if so desired.

Figure 5:
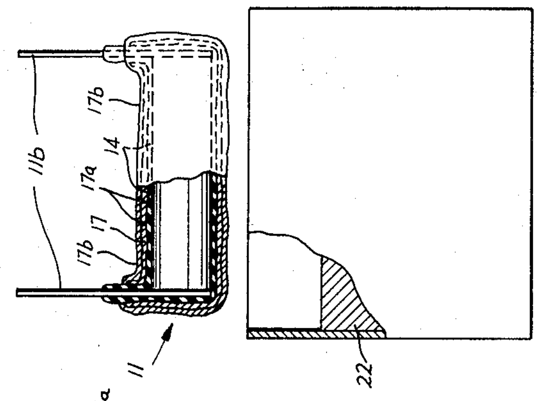
FIG. 5 illustrates an additional intermediate encapsulating step in accordance with the invention.

In forming the metal encasement 17 by dipping the capacitor 11 in the solder bath 18 as illustrated in FIG. 3, microscopic "cold shuts" or voids **17*a*, which are shown exaggerated in FIG. 5 for purposes of illustration, may be formed in the encasement whereby it is not completely impervious to moisture. Accordingly, to improve the moisture-proof capability of the encasement 17, the capacitor 11 also may be dipped in a second solder bath 22 which is in a molten condition and which preferably has a melting point on the order of, or below that of the solder composition used to form the encasement, and in any event not substantially greater than the melting point of the solder composition, so as to cause excessive melting and damage thereto. Then, upon withdrawal of the capacitor 11 from the molten solder bath, some of the solder will wet to the encasement 17 and form a metallurgical bond therewith to provide a thin second metal coating 17*b* which will be integral with the ecasement and which will seal the voids 17*a* therein. The outer protective coating 19 then may be formed in the same manner as described above and illustrated in FIG. 4. By way of illustration, the solder bath 22 may be the same composition as the solder bath 16** or may have a composition of 48.0% bismuth (Bi), 25.6% lead (Pb), 12.8% tin (Sn), 9.6% cadmium (Cd) and 4.0% indium (In), which has a melting temperature on the order of 142°–149°F.

While the encapsulating of an electrical device, such as the capacitor 11, with a moisture-proof layer or shield 17 has been disclosed, it is apparent that a metal shield having other characteristics also could be formed by the method of the invention. For example, a magnetic shield for an electrical device could be provided by electroplating or vapor depositing a nickel or other magnetic alloy on the inner insulating layer 14, or by combining a magnetic alloy powder with a low melting point solder and coating the resultant mixture on the inner insulating layer in a suitable manner.

Summarizing, it is seen that an encapsulated electrical device, such as the capacitor 11, and a relatively inexpensive method of fabricating it, has been disclosed in which the metal layer or encasement 17 forms a moisture-proof and/or other type protective barrier for the capacitor body **11*a* to produce a capacitor having a relatively stable capacitance under operating conditions. The metal moisture-proof layer 17** also is completely insulated electrically from the capacitor body

11$a$ and the capacitor leads 11$b$ by the inner insulating layer 14 and is protected against physical damage by the hard outer protective layer 19. Further, while the metal layer 17 has a relatively low melting point, whereby it may be reduced to a semi-molten or molten state because of excessive heat during operating conditions, since it is entrapped within the inner insulating layer 14 and the outer protective layer 19, which have relatively high melting points, it can subsequently resolidify when the capacitor 11 recools, without losing its moisture-proof capability. In addition, the encapsulating layers 14, 17 and 19 protect the capacitor body 11$a$ and the sections of the leads adjacent the body against physical damage, contamination and corrosion.

What is claimed is:

1. A method of encapsulating an electrical device having a body with a pair of projecting leads in insulating material and a metal material which does not readily bond to insulating material when in a molten state, which comprises:

forming an inner form-fitting layer of insulating material about the body of the electrical device and sections of the leads immediately adjacent the body;

then dipping the electrical device in a solution of the metal material which is at a temperature less than that of the melting point of the inner layer of insulating material, and which is in a semi-solid condition such that the metal material will solidify rapidly about the electrical device to produce a form-fitting metal protective encasement about the inner layer of insulating material and along sections of the leads when the electrical device is withdrawn from the semi-solid solution, with the metal encasement terminating at points short of the inner insulating layer to leave exposed insulated portions of the leads; and then forming an outer form-fitting protective layer of material, having a greater melting point than that of the metal protective encasement, about the metal protective encasement and the exposed insulated portions of the leads, with the material fusing to at least the exposed insulated portions of the leads to entrap the metal encasement within the inner insulating layer and the outer protective layer.

2. A method of encapsulating an electrical device having a body with a pair of projecting leads in insulating material and a solder composition which does not readily bond to insulating material when in a molten state, which comprises:

dipping the electrical device in a solution of resin insulating material which contains an insulating filler material to increase the consistency of the solution and to increase the thickness of the solution which will coat onto the body of the electrical device and the leads, to produce an inner form-fitting layer of insulating material about the body of the electrical device and sections of the leads immediately adjacent the body;

then dipping the electrical device in a solution of the solder composition which is at a temperature less than that of the melting point of the inner layer of insulating material, and which is in a semi-solid condition such that the solder composition will solidify rapidly about the electrical device to produce a form-fitting metal protective encasement about the inner layer of insulating material and along sections of the leads when the electrical device is withdrawn from the semi-solid solder solution, with the metal encasement terminating at points short of the inner insulating layer to leave exposed insulated portions of the leads;

then sealing any voids in the metal protective encasement by dipping the electrical device in a molten solder solution having a melting point not substantially greater than that of the solder composition used to form the metal protective encasement; and then applying insulating material having a greater melting point than the metal protective encasement, about the metal protective encasement and the exposed insulated portions of the leads in a heated liquid state, with the material fusing to at least the exposed insulated portions of the leads to produce an outer form-fitting protective layer which entraps the metal encasement within the inner insulating layer and the outer protective layer.

3. A method of encapsulating an electrical device having a body with a pair of projecting leads, as recited in claim 1, which further comprises:

forming the inner insulating layer by dipping the body of the electrical device and the sections of the leads adjacent the body in a resin solution which contains an insulating filler material to increase the consistency of the solution and to increase the thickness of the solution which will coat onto the body of the electrical device and the leads.

4. A method of encapsulating an electrical device having a body with a pair of projecting leads, as recited in claim 1, which comprises the additional intermediate step of:

sealing any voids in the metal protective encasement by dipping the electrical device in a molten metal solution having a melting point not substantially greater than that of the metal material used to form the metal protective encasement.

* * * * *